United States Patent
Tomii

(10) Patent No.: US 12,345,659 B2
(45) Date of Patent: Jul. 1, 2025

(54) METHOD FOR MEASURING DIC DEFECT SHAPE ON SILICON WAFER AND POLISHING METHOD

(71) Applicant: SHIN-ETSU HANDOTAI CO., LTD., Tokyo (JP)

(72) Inventor: Kazuya Tomii, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 94 days.

(21) Appl. No.: 17/914,631

(22) PCT Filed: Mar. 31, 2021

(86) PCT No.: PCT/JP2021/013755
§ 371 (c)(1),
(2) Date: Sep. 26, 2022

(87) PCT Pub. No.: WO2021/205950
PCT Pub. Date: Oct. 14, 2021

(65) Prior Publication Data
US 2023/0125000 A1    Apr. 20, 2023

(30) Foreign Application Priority Data

Apr. 8, 2020 (JP) .................................. 2020-069746

(51) Int. Cl.
*G01N 21/95* (2006.01)
*G01N 21/94* (2006.01)
*H01L 21/67* (2006.01)
*H01L 21/02* (2006.01)

(52) U.S. Cl.
CPC .......... *G01N 21/9505* (2013.01); *G01N 21/94* (2013.01); *H01L 21/67288* (2013.01); *H01L 21/02024* (2013.01)

(58) Field of Classification Search
CPC .............. G01N 21/9505; G01N 21/94; G01N 2021/8864; H01L 21/67288; H01L 21/02024
See application file for complete search history.

(56) References Cited

U.S. PATENT DOCUMENTS

| 7,477,372 B2 * | 1/2009 | Leslie .............. G01N 21/95607 |
| | | 356/237.2 |
| 10,782,247 B2 * | 9/2020 | Kim ....................... G01N 21/47 |

(Continued)

FOREIGN PATENT DOCUMENTS

| JP | 2006-278513 A | 10/2006 |
| JP | 2006-278515 A | 10/2006 |

(Continued)

OTHER PUBLICATIONS

Jun. 22, 2021 Search Report issued in International Patent Application No. PCT/JP2021/013755.

(Continued)

*Primary Examiner* — Hung V Nguyen
(74) *Attorney, Agent, or Firm* — Oliff PLC

(57) ABSTRACT

A method for measuring a DIC defect shape on a silicon wafer, the method including steps of: detecting a DIC defect on a main surface of the silicon wafer with a particle counter; specifying position coordinates of the detected DIC defect; and measuring a shape including at least a height or depth of the detected DIC defect by utilizing the specified position coordinates according to phase-shifting interferometry. The method for measuring a DIC defect shape by which the shape including size of DIC defect generated on a main surface of a silicon wafer is easily and precisely measured.

4 Claims, 2 Drawing Sheets

(56) References Cited

U.S. PATENT DOCUMENTS

| | | | |
|---|---|---|---|
| 10,957,609 B2 * | 3/2021 | Yen | G01N 21/65 |
| 11,890,719 B2 * | 2/2024 | Matsuda | B24B 37/245 |
| 2009/0097037 A1 | 4/2009 | Chappel | |
| 2011/0242312 A1 * | 10/2011 | Seki | G01N 21/9505 |
| | | | 348/125 |
| 2019/0304851 A1 | 10/2019 | Smith et al. | |
| 2019/0348270 A1 | 11/2019 | Morita | |
| 2020/0152471 A1 | 5/2020 | Aoki | |
| 2020/0306922 A1 | 10/2020 | Matsuda | |
| 2020/0343130 A1 | 10/2020 | Satou et al. | |

FOREIGN PATENT DOCUMENTS

| | | |
|---|---|---|
| JP | 2008-528960 A | 7/2008 |
| JP | 2010-021242 A | 1/2010 |
| JP | 2016-027407 A | 2/2016 |
| JP | 2018-101698 A | 6/2018 |
| JP | 2019-021719 A | 2/2019 |
| JP | 2019-058955 A | 4/2019 |
| JP | 2019-125722 A | 7/2019 |
| TW | 201916975 A | 5/2019 |

OTHER PUBLICATIONS

Oct. 6, 2022 International Preliminary Report on Patentability issued in International Patent Application No. PCT/JP2021/013755.
Nov. 20, 2024 Office Action issued in Taiwanese Patent Application No. 110111443.
Feb. 26, 2025 Office Action issued in Chinese Patent Application No. 202180024107.8.
Apr. 1, 2025 Office Action issued in Taiwanese Patent Application No. 110111443.

* cited by examiner

[FIG. 1]
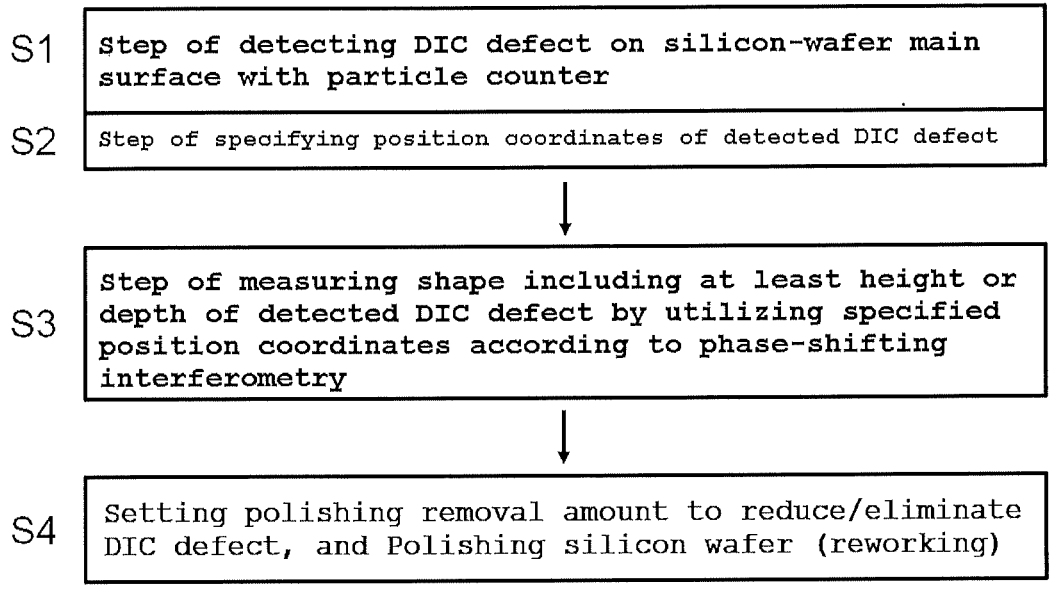
[FIG. 2]
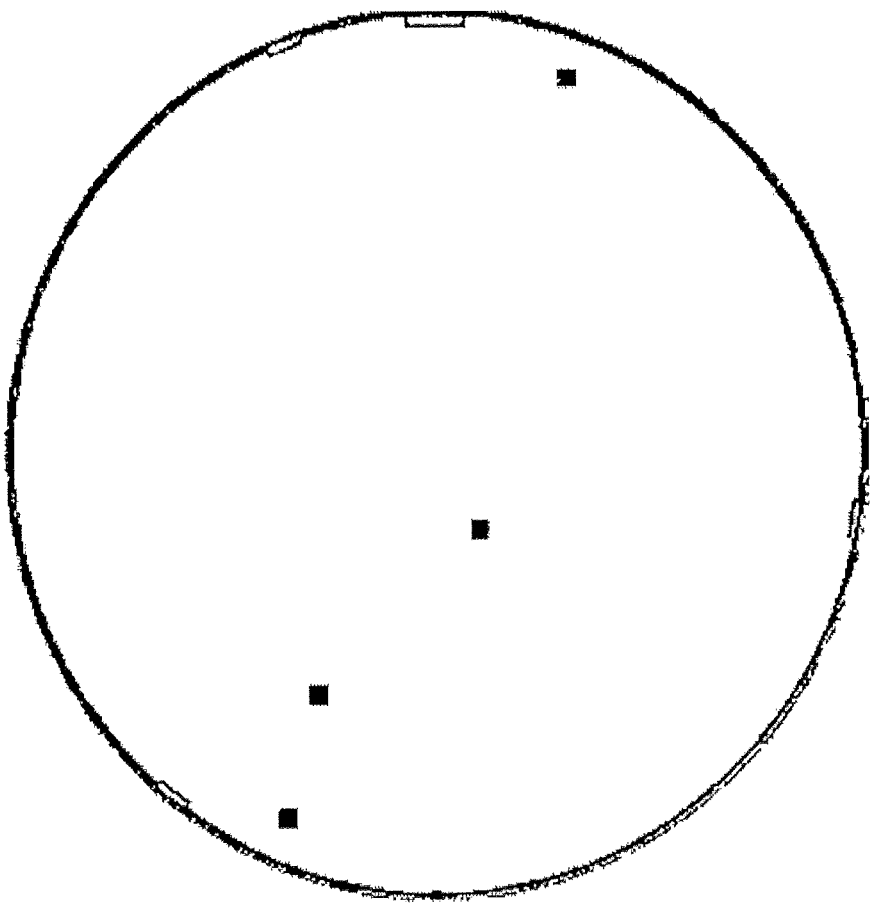

[FIG. 3]
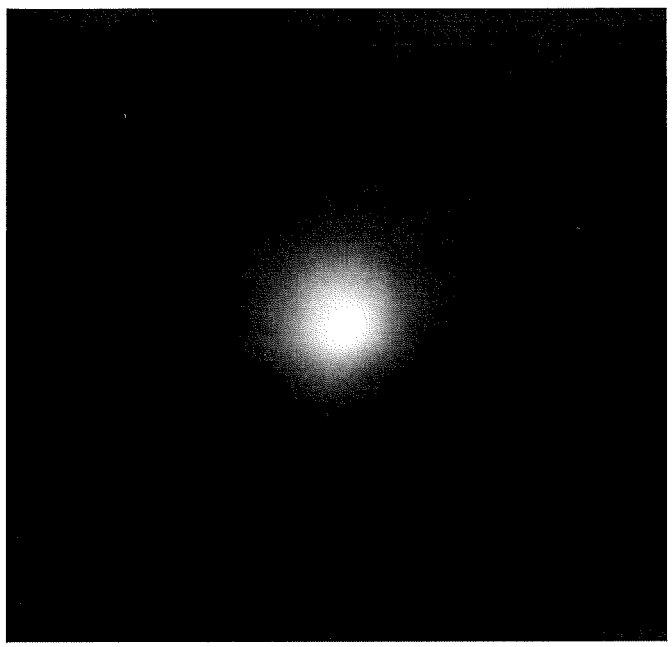
[FIG. 4]
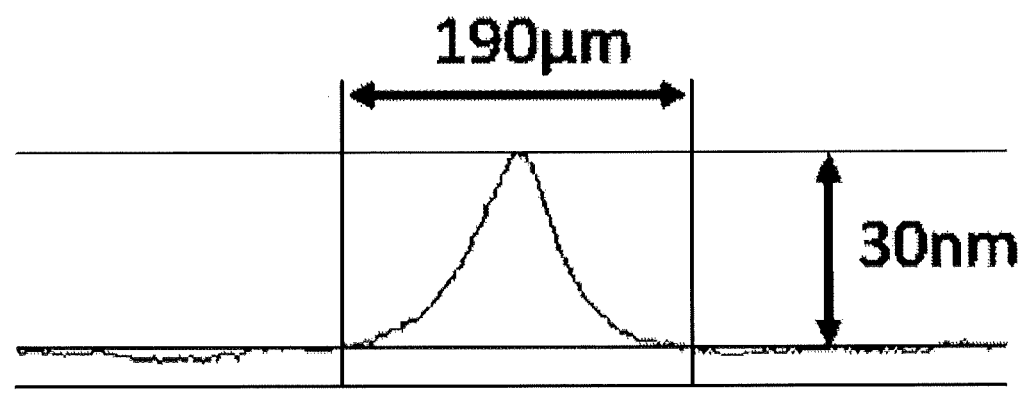

METHOD FOR MEASURING DIC DEFECT SHAPE ON SILICON WAFER AND POLISHING METHOD

TECHNICAL FIELD

The present invention relates to a method for measuring a shape of a DIC defect generated on a silicon wafer, and a polishing method.

BACKGROUND ART

DIC defects, if generated, on silicon-wafer surface influence device fabrication such that CMP fails or defocus occurs. Hence, to reduce or suppress DIC defects, Patent Documents 1 to 3 disclose improvements of polishing agent, polishing head, and polishing pad, respectively. Moreover, Patent Documents 4 and 5 introduce DIC-defect measurement methods.

Here, DIC defect will be described. DIC is capital letters of Differential Interference Contrast. As described in Patent Documents 3 to 5 also, DIC defects are defects detected mainly with such an evaluation apparatus as a particle counter SurfScan series available from KLA-Tencor Corporation, for example, SP2 or SP3, further specifically in DIC mode utilizing bright field observation. As natures of DIC defects, the defects are shallow and gradual. On silicon-wafer surface, the defects are possibly present in two forms of raised convex shape or recessed concave shape. Concretely, the shapes observed in many cases are characterized in that: the height or depth is several nanometers to several tens of nanometers; the width is several tens of micrometers to several hundreds of micrometers; and the ratio (aspect ratio) of height or depth to width is several thousand-fold.

CITATION LIST

Patent Literature

Patent Document 1: JP 2019-021719 A
Patent Document 2: JP 2019-058955 A
Patent Document 3: JP 2019-125722 A
Patent Document 4: JP 2018-101698 A
Patent Document 5: JP 2010-021242 A
Patent Document 6: JP 2016-027407 A

SUMMARY OF INVENTION

Technical Problem

As a DIC-defect detection method, a particle counter as described above is typically used for the detection. However, this detection method can only specify the position coordinates of DIC defect present on silicon wafer surface, and has a problem that the shape including size of DIC defect cannot be found. Patent Document 5 describes a DIC-defect measurement method with a common microscope utilizing interference, but fails to disclose specific numerical values. Thus, so far, no documents have mentioned the height or width of DIC defects accurately.

The present invention has been made to solve the above problems. An object of the present invention is to provide a method for easily and precisely measuring the shape including size of DIC defect generated on a main surface of a silicon wafer.

Solution to Problem

The present invention has been made to achieve the object, and provides a method for measuring a DIC defect shape on a silicon wafer, comprising steps of:
  detecting a DIC defect on a main surface of the silicon wafer with a particle counter;
  specifying position coordinates of the detected DIC defect; and
  measuring a shape including at least a height or depth of the detected DIC defect by utilizing the specified position coordinates according to phase-shifting interferometry.

Such a method for measuring a DIC defect shape makes it possible to easily and precisely measure the shape including size in a height direction of DIC defect generated on a main surface of a silicon wafer.

In this method for measuring a DIC defect shape, the main surface of the silicon wafer can be a surface on which a device is to be fabricated.

This enables accurate and easy evaluation of DIC defect that would influence device fabrication process.

Here, a method for polishing a silicon wafer can be provided which comprises:
  setting a polishing removal amount based on the shape of the DIC defect measured by the above method for measuring a DIC defect shape; and
  polishing the silicon wafer.

Thereby, a silicon wafer with reduced DIC defect level can be fabricated efficiently at low cost in high productivity.

Advantageous Effects of Invention

As described above, the inventive method for measuring a DIC defect shape makes it possible to precisely and easily measure the shape including size in the height direction of DIC defect generated on a main surface of a silicon wafer. Moreover, the use of the measured shape including size in the height direction of DIC defect enables accurate setting of polishing removal for DIC defect reduction, making it possible to reduce polishing time and polishing cost.

BRIEF DESCRIPTION OF DRAWINGS

FIG. 1 is a flowchart illustrating a method for measuring a DIC defect shape according to the present invention.

FIG. 2 shows an example of a DIC defect map evaluated with a particle counter in Example according to the present invention.

FIG. 3 shows an example of a phase-shift interference image obtained in Example according to the present invention.

FIG. 4 shows an example of a profile with which the phase analysis was performed on a DIC defect shown in the present Example.

DESCRIPTION OF EMBODIMENTS

Hereinafter, the present invention will be described in detail. However, the present invention is not limited thereto.

As noted above, there have been demands for a method for measuring a DIC defect shape by which the shape including size of DIC defect generated on a main surface of a silicon wafer is precisely and easily measured.

The present inventor has earnestly studied the above problems and consequently found that the shape including size in a height direction of DIC defect generated on a main surface of a silicon wafer can be precisely and easily measured by a method for measuring a DIC defect shape on a silicon wafer, the method including steps of: detecting a DIC defect on a main surface of the silicon wafer with a particle counter; specifying position coordinates of the detected DIC defect; and measuring a shape including at least a height or depth of the detected DIC defect by utilizing the specified position coordinates according to phase-shifting interferometry. This finding has led to the completion of the present invention.

Hereinbelow, the shape measurement method according to one embodiment of the present invention and a method for polishing a silicon wafer will be described with reference to the drawings.

FIG. 1 is a flowchart illustrating the inventive method for measuring a DIC defect shape and method for polishing a silicon wafer. Before the flow shown in FIG. 1 starts (before S1), for example, steps of preparing a silicon single crystal ingot, slicing the ingot, etching, polishing, heating, and so forth may be performed. Here, the most typical step during which DIC defect is generated is said to be polishing step. In this polishing step, a liquid suspension called slurry is used. DIC defect is presumably generated by not appropriately treating this slurry after polishing. Nevertheless, there are many unknown facts about DIC defect generation, and at present it cannot be determined that the polishing step is the only causative step as described above.

The inventive method for measuring a DIC defect shape performs steps of: detecting a DIC defect on a main surface of a silicon wafer with a particle counter as shown by S1 in FIG. 1; specifying position coordinates of the detected DIC defect as shown by S2; and further measuring a shape at the coordinates as shown by S3. The particle counter used for the DIC defect detection is generally SurfScan series available from KLA-Tencor Corporation as mentioned above, but may be other apparatuses as long as DIC defect can be detected. Further, the apparatus is preferably capable of outputting the position coordinates of the detected DIC defect. In this case, the step S1 and the step of specifying position coordinates of the detected DIC defect shown by S2 can be performed almost simultaneously, and the coordinate position can be specified quickly with high precision in comparison with a case of manually specifying the coordinate position as will be described later. In this manner, the inventive method for measuring a DIC defect shape includes an embodiment in which the steps S1 and S2 are carried out almost simultaneously.

Now, the method of specifying the coordinates will be described. With SurfScan series mentioned above, the coordinates can be outputted. Even with other types of particle counter evaluation apparatus or method incapable of outputting coordinates, the coordinates can be specified and acquired manually by outputting a map or observation image of the entire surface of the silicon wafer which show the detected DIC defect. In this event, the coordinate system is not limited, and any coordinate system may be employed, such as X-Y coordinates or r-θ coordinates called polar coordinates, as long as the site of the DIC defect can be specified.

Next, the step as shown by S3 in FIG. 1 is performed to measure the shape including at least a height or depth of the detected DIC defect by utilizing the specified position coordinates of the DIC defect according to phase-shifting interferometry. Note that the phase-shifting interferometry is as described in Patent Document 6 but is briefly described here. In this measurement method, interference fringes of monochromatic light are observed while the observation height is being changed to conduct phase analysis, so that the height resolution of the order of nanometers is obtained. This phase-shifting interferometry is an observation method whose popularity is increasing in observation employing interferometry. Thus, employing the phase-shifting interferometry enables convenient and high precision measurement of the shape of DIC defect, which is shallow and gradual defect, particularly, the shape including size observed in a height direction.

In the inventive method for measuring a DIC defect shape, a surface on which a device is to be fabricated is preferably chosen as the main surface of the silicon wafer where the DIC defect shape is measured (herein the front and back surfaces of a wafer may be referred to as "main surface" in a distinctive manner). Normally, DIC defect on such a device fabrication surface is problematic in the device fabrication process. Evaluating the device fabrication surface allows accurate and easy evaluation of DIC defect that affects the device fabrication process.

In addition, the present inventor has found that the utilization of the DIC defect shape found as described above, particularly data on height or depth, enables significant enhancement of the efficiency in reducing DIC defects by polishing a silicon wafer with the DIC defects.

By appropriately polishing a silicon wafer detected to have DIC defects, the DIC defects can be reduced. Conventionally, it has been impossible to measure particularly the shape including size in the height direction of DIC defects detected from individual wafers. Hence, the removal amount has been set uniformly based on the shape of common DIC defect.

Nevertheless, setting a polishing removal based on the DIC defect shape measured according to the method for measuring a DIC defect shape and then polishing the silicon wafer as shown by S4 in FIG. 1 make it possible to set an appropriate polishing removal for each silicon wafer. Thus, the polishing does not have to be performed more than necessary. This enhances the productivity and can reduce the cost. Note that the polishing removal amount to be set is preferably set in such a range that the removal amount is at least five times, for example, 5 times to 50 times, preferably 10 times to 20 times, as high or deep as the measured height or depth of the DIC defect. Thereby, more reliable and efficient DIC defect reduction is possible.

Example

Hereinafter, the present invention will be specifically described with reference to Example. However, the present invention is not limited thereto.

Example

In the present Example, a silicon wafer used had a diameter of 300 mm, and the main surface thereof was a (100) plane. Note that, briefly speaking, the silicon wafer used had been subjected to steps in the manufacturing flow that included silicon single crystal ingot fabrication, ingot slicing, chamfering, lapping, etching, polishing, and cleaning in this order.

FIG. 2 is an example of a map of a sample of the cleaned silicon wafer evaluated using a particle counter. As the particle counter, SurfScan SP3 manufactured by KLA-Tencor Corporation was used, and the measurement was performed in DIC mode of bright field observation. It can be seen from FIG. 2 that four DIC defects (indicated by black points) were detected from the used sample. Note that the position coordinates of each of the four sites were also outputted as coordinate data. The process of detecting the DIC defects until outputting the position coordinates corresponds to S1 and S2 in FIG. 1.

Next, the step S3 in FIG. 1 was performed. The position coordinates of the DIC defects outputted in the step S2 were observed by employing the phase-shifting interferometry. In this observation, an OPTELICS HYBRID microscope manufactured by Lasertec Corporation was used which was equipped with a 10× two-beam interference objective lens. Moreover, for the hybrid microscope, a movable stage having position-coordinate precision in the order of micrometers was prepared and installed to allow immediate observation of the position coordinates outputted by the particle counter.

deep as the height and depth of the DIC defect. Thus, the DIC defects were eliminated, or the number and the height or depth of the DIC defects were reduced. Table 1 shows the DIC defect height and the rework time of each sample. Note that, herein, "rework time" refers to a time required for the polishing in the reworking (not including the cleaning step etc.).

Comparative Example

The conditions of Comparative Example were set in a conventional manner. Hence, when DIC defect generation was detected with a particle counter, the reworking was performed with uniform rework removal amount. Specifically, the removal was set to 2 μm, which means the rework time of 5 minutes (Table 1).

TABLE 1

| Sample # | | 1 | 2 | 3 | 4 | 5 | 6 | 7 | 8 | 9 | 10 | Total |
|---|---|---|---|---|---|---|---|---|---|---|---|---|
| DIC defect height (nm) according to phase-shifting interferometry | | 29.5 | 42.2 | 25.2 | 11.6 | 35.4 | 81.9 | 22.6 | 56.7 | 79.3 | 54.3 | — |
| Rework time (min.) | Example | 1.1 | 1.6 | 1.3 | 1.0 | 1.3 | 3.1 | 1.0 | 2.1 | 3.0 | 2.0 | 17.5 |
| | Comparative Example | 5.0 | 5.0 | 5.0 | 5.0 | 5.0 | 5.0 | 5.0 | 5.0 | 5.0 | 5.0 | 50.0 |

FIG. 3 is an example of a phase-shift interference image for the observation of the position coordinates of the DIC defect outputted in S1 above. Note that this FIG. 3 shows an example of observing a DIC defect with a convex shape. The grayscale of the figure indicates the height of the DIC defect. The most white portion at the center of the figure indicates the top portion of the height of the DIC defect.

FIG. 4 shows a profile with which the phase analysis was conducted on one of the DIC defects which was shown in FIG. 3 by using the hybrid microscope. In this example, the measurement showed that the DIC defect height was 30 nm, and the DIC defect width was 190 μm. Note that, as shown in FIG. 2, the used silicon wafer had four DIC defects, and the examination by the present inventor revealed that the multiple DIC defects detected in the same wafer had substantially the same heights or depths. Since it can be understood that similar values are exhibited from the other three sites measured in this Example also than the DIC defect in FIGS. 3 and 4, the result measured at one site of the DIC defect as shown in FIGS. 3 and 4 can be regarded as the representative value of the DIC defect size of the sample (silicon wafer). The step S3 in FIG. 1 has been described. In this manner, the shape including the size in the height direction of the DIC defects of the sample (silicon wafer) was measured.

Next, based on the shape including the height or depth of the DIC defect obtained by the measurement, the polishing removal amount was set and reworked. Note that rework refer to performing the polishing and cleaning steps again on the product with DIC defect generation. The purpose of reworking is to eliminate the DIC defects, and reduce the number and the height or depth of the DIC defects.

Here, ten samples were used, and DIC defects were detected from all the samples by using the particle counter SP3. The DIC defect height was measured at one site on each of the ten samples. For each sample, appropriate rework removal amount was set for the polishing, and the rework time was measured. Note that the reworking was performed by setting the removal amount for the polishing such that the removal amount was 10 to 20 times as high or It can be seen that the inventive method for measuring a DIC defect shape is capable of accurately and easily measuring the height (or depth) of the DIC defects. Moreover, when the rework polishing removal amount was set by utilizing the DIC defect height obtained as in Example, the rework time was reduced to a maximum of 80%, and the total rework time of the ten samples was also reduced by 65% in comparison with Comparative Example as shown in Table 1. Consequently, considerable reduction was achieved in comparison with Comparative Example. Note that the quality related to the DIC defects after the reworking in Example was found to be equivalent to that in Comparative Example. These revealed that the inventive method for measuring a DIC defect shape demonstrates various effects, such as cost reduction and productivity enhancement, besides shortened rework time.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A method for measuring a DIC defect shape on a silicon wafer, comprising steps of:
    detecting a DIC defect on a main surface of the silicon wafer with a particle counter;
    transferring position coordinates of the detected DIC defect from the particle counter to a phase-shifting interferometer; and
    positioning the phase-shifting interferometer based on the transferred position coordinates to measure a shape including at least a height or depth of the detected DIC defect, wherein
    a width of the DIC defect is on the order of tens of micrometers to hundreds of micrometers.

2. The method for measuring a DIC defect shape according to claim 1, wherein the main surface of the silicon wafer is a surface on which a device is to be fabricated.

3. A method for polishing a silicon wafer, comprising:
setting a polishing removal amount based on the shape of the DIC defect measured by the method for measuring a DIC defect shape according to claim 1; and
polishing the silicon wafer.

4. A method for polishing a silicon wafer, comprising:
setting a polishing removal amount based on the shape of the DIC defect measured by the method for measuring a DIC defect shape according to claim 2; and
polishing the silicon wafer.

* * * * *